(12) United States Patent
Ohmori et al.

(10) Patent No.: US 8,853,806 B2
(45) Date of Patent: Oct. 7, 2014

(54) MEMORY ELEMENT AND MEMORY

(75) Inventors: Hiroyuki Ohmori, Kanagawa (JP);
Masanori Hosomi, Tokyo (JP);
Kazuhiro Bessho, Kanagawa (JP);
Yutaka Higo, Kanagawa (JP); Kazutaka Yamane, Kanagawa (JP); Hiroyuki Uchida, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 13/221,261

(22) Filed: Aug. 30, 2011

(65) Prior Publication Data

US 2012/0061779 A1 Mar. 15, 2012

(30) Foreign Application Priority Data

Sep. 9, 2010 (JP) ................. 2010-202332

(51) Int. Cl.
*H01L 29/82* (2006.01)

(52) U.S. Cl.
USPC ..... 257/421; 257/295; 257/427; 257/E43.004

(58) Field of Classification Search
USPC .......... 257/E21.665, E27.006, 108, 414, 421, 257/422, 425, 427; 365/32, 33, 130, 158, 365/171, 173
See application file for complete search history.

(56) References Cited

U.S. PATENT DOCUMENTS

| | | | |
|---|---|---|---|
| 6,956,766 B2 | 10/2005 | Nakamura | |
| 7,193,284 B2 * | 3/2007 | Yagami | 257/421 |
| 7,196,386 B2 * | 3/2007 | Kadono et al. | 257/421 |
| 2005/0057992 A1 * | 3/2005 | Yagami | 365/222 |
| 2006/0141640 A1 | 6/2006 | Huai et al. | |
| 2008/0117008 A1 * | 5/2008 | Komuro et al. | 335/302 |
| 2008/0253174 A1 * | 10/2008 | Yoshikawa et al. | 365/158 |
| 2009/0079018 A1 * | 3/2009 | Nagase et al. | 257/421 |
| 2009/0080124 A1 | 3/2009 | Yoshikawa | |
| 2009/0224300 A1 * | 9/2009 | Yamagishi et al. | 257/295 |
| 2009/0251951 A1 | 10/2009 | Yoshikawa et al. | |
| 2010/0097847 A1 | 4/2010 | Ohmori | |
| 2011/0062537 A1 * | 3/2011 | Oh et al. | 257/421 |
| 2012/0061779 A1 * | 3/2012 | Ohmori et al. | 257/421 |

FOREIGN PATENT DOCUMENTS

| | | |
|---|---|---|
| JP | 2004-193595 | 7/2004 |
| JP | 2008-526046 | 7/2007 |
| JP | 2009-81215 | 4/2009 |
| JP | 2009-212156 | 9/2009 |
| JP | 2009-239121 | 10/2009 |
| JP | 2010-98245 | 4/2010 |

* cited by examiner

*Primary Examiner* — Julio J Maldonado
*Assistant Examiner* — Jaehwan Oh
(74) *Attorney, Agent, or Firm* — K&L Gates LLP

(57) ABSTRACT

There is provided a memory element including a magnetic layer that includes at least one kind of element selected from a group consisting of Fe, Co, and Ni, and carbon, has a content of carbon that is equal to or greater than 3 atomic % and less than 70 atomic % with respect to a total content of Fe, Co, and Ni, and has magnetic anisotropy in a direction perpendicular to a film face; and an oxide layer that is formed of an oxide having a sodium chloride structure or a spinel structure and that comes into contact with the magnetic layer.

14 Claims, 6 Drawing Sheets

MEMORY ELEMENT AND MEMORY

CROSS REFERENCES TO RELATED APPLICATIONS

The present application claims priority to Japanese Priority Patent Application JP 2010-202332 filed in the Japan Patent Office on Sep. 9, 2010, the entire contents of which are hereby incorporated by reference.

BACKGROUND

The present application relates to a memory element that includes a magnetic layer having magnetic anisotropy perpendicular to a film face, and a memory having the memory element.

In an information device such as a computer, a highly dense DRAM that operates at a high speed has been widely used as a random access memory. However, the DRAM is a volatile memory in which information is erased when power is turned off, such that a non-volatile memory in which the information is not erased is desirable. As a candidate for the non-volatile memory, a magnetic random access memory (MRAM) in which the information is recorded by magnetization of a magnetic material has attracted attention and therefore has been developed.

As a method of performing a recording of an MRAM, a method of inverting magnetization using a current magnetic field, or a method of causing a magnetization inversion by directly injecting an electron that is spin-polarized into a recording layer (for example, refer to Japanese Unexamined Patent Application Publication No. 2004-193595) may be exemplified. Among these, spin injection magnetization inversion, which can make a write current small as a memory element size decreases, has attracted attention. In addition, a method of using a perpendicular magnetization film in which a magnetization direction of a magnetic material faces a perpendicular direction, for the miniaturization of a memory element, has been studied (for example, refer to Japanese Unexamined Patent Application Publication No. 2009-81215). In addition, a method of performing highly dense recording using migration of a magnetic domain wall has been devised (refer to Japanese Unexamined Patent Application Publication No. 2010-98245).

SUMMARY

In a perpendicular magnetization film used in such a magnetic memory, it is necessary to decrease a magnetic braking constant for allowing a spin torque to work effectively. However, an existing perpendicular magnetization film, such as TbFeCo or CoPt has a large magnetic braking constant, and thus is not suitable for such a magnetic memory using spin torque. In addition, there is a problem in that a magnetoresistance change when forming a magnetic tunnel junction is small.

It is desirable to provide a memory element that has a small magnetic braking constant and that is capable of decreasing a driving current.

According to an embodiment, there is provided a memory element including a magnetic layer that includes at least one kind of element selected from a group consisting of Fe, Co, and Ni, and carbon, has a content of carbon that is equal to or greater than 3 atomic % and less than 70 atomic % with respect to a total content of Fe, Co, and Ni, and has magnetic anisotropy in a direction perpendicular to a film face. In addition, the memory element includes an oxide layer that is formed of an oxide having a sodium chloride structure or a spinel structure and that comes into contact with the magnetic layer.

In addition, according to another embodiment, there is provided a memory including the memory element and an interconnect that supplies a current to the memory element.

According to the memory element and the memory according to the embodiments, it is possible to form a magnetic layer that has stable perpendicular magnetization in which a magnetic braking constant is small by forming a magnetic layer having the above-described composition on an oxide layer having a sodium chloride structure or a spinel structure. Therefore, it is possible to realize a memory element that can operate at a high speed with a low current.

According to the embodiments, it is possible to provide a memory element that has a small magnetic braking constant and that is capable of decreasing a driving current.

Additional features and advantages are described herein, and will be apparent from the following Detailed Description and the figures.

BRIEF DESCRIPTION OF THE FIGURES

FIGS. 3A and 3B are diagrams illustrating a polar Kerr effect, in which FIG. 3A illustrates the polar Kerr effect before a heat treatment, and FIG. 3B illustrate the polar Kerr effect after a heat treatment at 300° C., in regard to samples of an experiment example 4;

DETAILED DESCRIPTION

Embodiments of the present application will be described below in detail with reference to the drawings.

In addition, description will be made in the following order.

Figure 1:
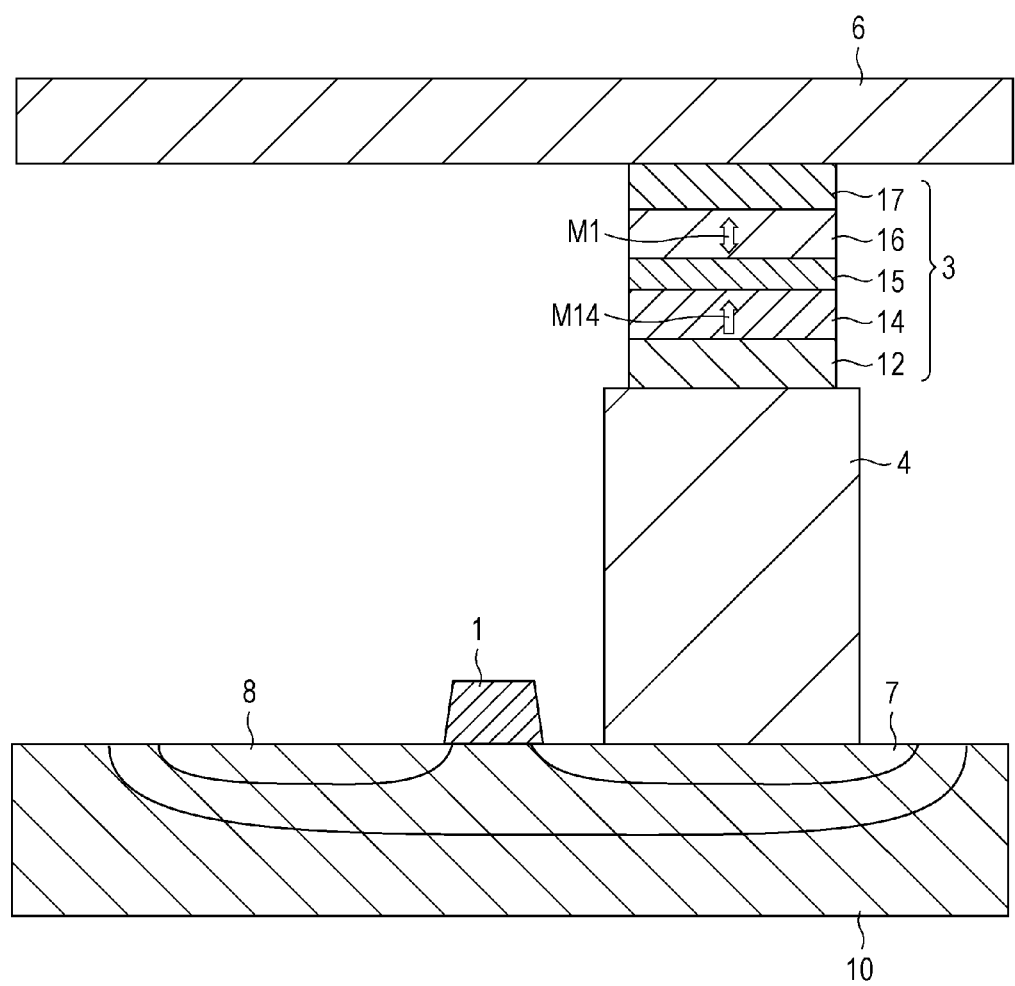
FIG. 1 is a schematic configuration view of a memory according to an embodiment.

1. Embodiment of Memory Element of Present Application
2. Experiment Example of Memory Element of Embodiment 1. Embodiment of Memory Element of Present Application Configuration Example of Memory A schematic configuration diagram (cross-sectional view) of a memory according to an embodiment is shown in FIG. 1

This memory includes a memory element, which can retain information using a magnetization state, disposed in the vicinity of an intersection between two kinds of address interconnects (for example, a word line and a bit line) that are orthogonal to each other.

Specifically, a drain region 8, a source region 7, and a gate electrode 1, which make up a selection transistor that selects each memory cell, are formed at portions separated by an element separation layer of a semiconductor substrate 10 such as a silicon substrate, respectively. Among these, the gate electrode 1 functions also as an address interconnect (for example, a word line) that extends in the front-back direction in the drawing.

The drain region 8 is formed commonly to a plurality of selection transistors formed on the substrate, and an interconnect is connected to the drain region 8.

A memory element 3 is disposed between the source region 7 and the address interconnect (for example, a bit line) 6 that is disposed over the source region 7. The memory element 3 includes a memory layer that is formed of a magnetic layer whose magnetization direction is inverted by spin injection.

In addition, the memory element 3 is disposed in the vicinity of an intersection between one side address interconnect (gate electrode)$_1$, and the other side address interconnect 6.

The memory element 3 is connected to the bit line (address interconnect)$_6$, and is connected to the source region 7 through a contact layer 4.

In this manner, it is possible to supply a current to the memory element 3 through two kinds of address interconnects 1 and 6. In addition, it is possible to invert a magnetization direction of the memory layer through spin injection by flowing a current to the memory element 3 in a vertical direction thereof (a lamination direction of the memory element 3).

Configuration Example of Memory Element

Next, the memory element 3 of this embodiment will be described.

As shown in FIG. 1, the memory element 3 has a lamination structure in which an underlying layer 12, a magnetization-fixed layer (reference layer) 14, an oxide layer 15, a magnetic layer 16, and a carbon adsorbing layer 17 are sequentially laminated on the contact layer 4. In addition, an upper electrode (not shown) is provided on the carbon adsorbing layer 17 and a lower electrode (not shown) is provided at the bottom of the underlying layer 12. In addition, an interconnect that is connected to the bit line is provided to the upper electrode, such that the memory element 3 is configured.

The memory element 3 performs a storage of information using a direction of magnetization M1 of the magnetic layer 16 having uniaxial anisotropy. In addition, a current is applied in a direction perpendicular to a film face and thus spin torque magnetization inversion is generated and thereby performs writing.

The magnetization-fixed layer 14 is provided at a lower layer of the magnetic layer 16 in which the direction of the magnetization M1 is inverted by spin injection. The oxide layer 15 is provided between the magnetic layer 16 and the magnetization-fixed layer 14, and the magnetic layer 16 and the magnetization-fixed layer 14 make up an MTJ element.

Memory Element: Magnetization-Fixed Layer

The magnetization-fixed layer 14 may be configured by only a ferromagnetic layer or may be configured in such a manner that the magnetization direction is fixed by using an anti-ferromagnetic combination of an anti-ferromagnetic layer and a ferromagnetic layer. In addition, the magnetization-fixed layer 14 may be configured by a single layer of a ferromagnetic layer, or a ferri-pin structure in which a plurality of ferromagnetic layers is laminated through a non-magnetic layer.

When the magnetization-fixed layer 14 is configured by the laminated ferri-pin structure, it is possible to decrease sensitivity of the magnetization-fixed layer with respect to an external magnetic field, such that unnecessary magnetization fluctuation in the magnetization-fixed layer with respect to the external magnetic field is suppressed, and thereby it is possible to stably operate the memory element. In addition, it is possible to adjust a thickness of each ferromagnetic layer, such that it is possible to suppress a leakage magnetic field from the magnetization-fixed layer.

It is necessary for the magnetization-fixed layer 14 to have a magnetization inversion current larger than in the magnetic layer 16, such that it is necessary to make a thickness of the magnetization-fixed layer 14 larger than that of the magnetic layer 16. An inversion current difference between the magnetization-fixed layer 14 and the magnetic layer 16 is sufficiently secured. For example, the thickness may be 1 to 40 nm.

As a material of the ferromagnetic layer making up the magnetization-fixed layer 14, an alloy including Co as a main component, and at least one element selected from a group consisting of Cr, Ta, Nb, V, W, Hf, Ti, Zr, Pt, Pd, Fe, and Ni. For example, CoCr, CoPt, CoCrTa, CoCrPt, or the like may be used. In addition, an amorphous alloy of Tb, Dy, Gd, and a transition metal may be used. For example, TbFe, TbCo, TbFeCo, or the like may be used. As a non-magnetic material making up the laminated ferri-pin structure, Ru, Re, Ir, Os, an alloy thereof, or the like may be used.

Memory Element: Oxide Layer

The oxide layer 15 is formed of an oxide having a sodium fluoride (NaCl) structure or a spinel structure.

As an oxide having the sodium fluoride structure, for example, MgO, CoO, NiO, TiO, or the like may be used. Particularly, in a case where MgO is used, it is possible to realize stable perpendicular magnetic anisotropy, and when being used as a tunnel barrier layer, it is possible to obtain a large magnetoresistance (MR) ratio, such that MgO is suitable for a magnetic memory.

As an oxide having the spinel structure, for example, $MgAl_2O_4$, $FeAl_2O_4$, $CoAl_2O_4$, $MgCr_2O_4$, $MgGa_2O_4$, or the like may be used. Particularly, when using $MgAl_2O_4$, it is possible to obtain a large perpendicular magnetic anisotropy, and a large MR ratio, such that $MgAl_2O_4$ is suitable.

Such an oxide may be formed through an rf sputtering method using on oxide target, and may be formed in an oxygen atmosphere using a metal target. In addition, the oxide may be formed by forming a metal film, and then by leaving the metal film as it is in an oxygen atmosphere or a plasma atmosphere containing oxygen for an appropriate time. In addition, a CVD (Chemical Vapor Deposition) method may be used.

Memory Element: Magnetic Layer

A magnetic layer 16 includes at least one kind of element selected from a group consisting of Fe, Co, and Ni, and carbon.

The content of carbon included in the magnetic layer 16 is equal to or greater than 3 atomic % and less than 70 atomic % with respect to a total content of Fe, Co, and Ni. When the content of carbon in the magnetic layer 16 is set to this range, it is possible to obtain a stable perpendicular anisotropy. In addition, in regard to the magnetic layer 16, when a large content of Fe is included in a portion that comes into contact with an oxide layer 15, it is possible to increase a perpendicular magnetic anisotropy or an MR ratio.

When a carbon adsorbing layer 17 is formed on the magnetic layer 16 and then a heat treatment is performed, the carbon included in the magnetic layer 16 is diffused to the carbon adsorbing layer 17 side. Therefore, the content of carbon included in the magnetic layer 16 becomes different between the time of forming the magnetic layer 16 and when the memory element is formed and then the heat treatment is performed. A composition ratio of carbon in the above-described magnetic layer 16 is defined with respect to carbon in the magnetic layer after the heat treatment. Carbon atoms included at the time of forming the magnetic layer 16 diffuse mainly into the carbon adsorbing layer side by the heat treatment, but when content of carbon atoms included in the magnetic layer and a portion within a distance of 1 nm from an edge of the magnetic layer is set to the above-described range, it is possible to obtain stable perpendicular magnetic anisotropy.

In regard to a content of Co included in the magnetic layer 16, it is preferable that a ratio of Co to Fe be greater than 1 atomic % and equal to or less than 30 atomic %. In addition, in regard to a content of Ni included in magnetic layer 16, it is preferable that a ratio of Ni to Fe be greater than 1 atomic % and equal to or less than 70 atomic %.

When Co and Ni are included in addition to Fe, the magnetic layer 16 has a large coercive force and therefore is excellent as a perpendicular magnetization film. In addition, when the content of Co and Ni is excessive, the perpendicular magnetic anisotropy is decreased. Therefore, it is preferable that the content of Co be 30 atomic % or less with respect to Fe, and the content of Ni be 70 atomic % or less with respect to Fe.

In addition, for the purpose of improving a characteristic of the magnetic layer 16, an element other than Fe, Co, Ni, and carbon may be added.

It is preferable that a thickness of the magnetic layer 16 be 0.5 to 2 nm. When the thickness of the magnetic layer 16 is smaller than 0.5 nm, it is difficult to obtain sufficient magnetization as a memory layer of the memory element. In addition, when the thickness is larger than 2 nm, it is difficult to obtain perpendicular magnetization in the magnetic layer 16.

In addition, the magnetic layer 16 may be a single layer formed of the above-described element, or may be divided into a plurality of layers including a layer including Fe and a layer including carbon such as Fe/CoC. At this time, the layer including Fe is formed at the oxide layer 15 side, and the layer including carbon is formed at the carbon adsorbing layer 17 side. Even when the magnetic layer 16 is formed by a plurality of layers, it is preferable that the total thickness of the magnetic layer be 0.5 to 2 nm from the above-described reason.

Particularly, In regard to the magnetic layer 16, when a large content of Fe is included in a portion that comes into contact with the oxide layer 15, the perpendicular magnetic anisotropy or the MR ratio become large, such that this configuration is preferable. However, when a large content of Fe is included in a portion apart from the oxide layer 15, the deterioration of the perpendicular magnetic anisotropy becomes large. Therefore, when the film thickness of the magnetic layer 16 is made to be large, it is preferable to divide the magnetic layer 16 into a plurality of layers such as Fe/CoC.

The magnetic layer 16 may be formed through a sputtering method by using a compound target or a mixture target of metal and carbon. In addition, when forming the magnetic layer 16, a hydrocarbon gas such as methane gas may be included in a sputtering gas. In addition, the magnetic layer 16 may be formed, for example, through a CVD method. In addition, after a metal film is formed, carbon atoms may be introduced into the film through an ion injection method or the like.

Memory Element: Carbon Adsorbing Layer

The carbon adsorbing layer 17 is a layer including an element that adsorbs carbon (carbon adsorbing element), and is formed to adjust a content of carbon (including the above-described carbon) in the magnetic layer 16. The carbon adsorbing layer 17 includes at least one selected from a group consisting of Ti, V, Nb, Zr, Ta, Hf, and Y as the carbon adsorbing element. When the carbon adsorbing layer 17 is disposed on the magnetic layer 16 and an appropriate heat treatment is performed, carbon in the magnetic layer 16 and an element in the carbon adsorbing layer 17 are chemically coupled, and therefore rearrangement of atoms is promoted. Accordingly, it is possible to obtain large perpendicular magnetic anisotropy by the magnetic layer 16. In addition, when using the above-described material, the carbon adsorbing layer 17 also functions as a protective layer.

The carbon adsorbing layer 17 may use the above-described carbon adsorbing element alone, or may include the carbon adsorbing element and another element. For example, the carbon adsorbing layer 17 may be formed of an alloy of one kind or more of the above-described carbon adsorbing elements and one kind or more selected from a group consisting of Fe, Co, and Ni.

As described above, when the magnetic layer 16, which includes the magnetic metal of Fe, Co, and Ni, and carbon, is formed on the oxide film 15 having a sodium fluoride structure or a spinel structure, it is possible to from a magnetic layer in which a magnetic braking constant becomes small, and has stable perpendicular magnetization. In addition, the carbon adsorbing layer 17 including Ti, V, Nb, Zr, Hf, Ta, and Y is laminated on the magnetic layer 16 and a heat treatment is performed thereto, such that it is possible to form a magnetic layer 16 that has a small magnetic braking constant and stable perpendicular magnetization.

Therefore, when the memory layer of the memory element is formed of the above-described magnetic layer, and the above-described oxide layer and carbon adsorbing layer are used, it is possible to realize a perpendicular magnetization film allowing spin torque to work efficiently. Therefore, in regard to a magnetic memory using spin torque, it is possible to realize a magnetic memory element that can operate at a high speed with a low current.

In addition, an arbitrary non-magnetic layer of 0.5 nm or less may be inserted between the magnetic layer 16 and the carbon adsorbing layer 17. Even when the non-magnetic layer is inserted, carbon in the magnetic layer 16 and an element in the carbon adsorbing layer 17 are coupled with each other through a heat treatment, and therefore the rearrangement of atoms is performed. Therefore, the perpendicular magnetic anisotropy of the magnetic layer 16 does not disappear.

As the non-magnetic layer, for example, Pd, Au, Cr, Cu, Mo, Ag, Ru, W, Ir, and Pt may be used. When the non-magnetic layer is inserted, a magneto-striction of the memory element may be changed. Therefore, the non-magnetic layer may be inserted to be used for adjusting the magneto-striction of the memory element or the like.

In addition, a thin non-magnetic layer is formed between the magnetic layer 16 and the carbon adsorbing layer 17, carbon in the magnetic layer diffuses to the carbon adsorbing layer through the non-magnetic layer by the heat treatment. Therefore, even when the non-magnetic layer is formed, the coercive force of the magnetic layer does not vary largely.

In addition, the configuration including the above-described oxide layer, magnetic layer, and carbon adsorbing layer may be applied to a magnetic domain wall migration-type memory element including a magnetic layer, an oxide layer, and a carbon adsorbing layer, in addition to memory element using spin torque inversion. For example, the above-described carbon adsorbing layer is formed on a substrate, and the above-described magnetic layer is formed on the carbon adsorbing layer. Then, this laminated body is processed to have a rectangular strip shape and an electrode is formed on both ends of a memory element, and therefore it is possible to form a magnetic domain wall migration-type memory element.

2. Experiment Example of Memory Element of Present Application

An experiment example of a memory element to which the embodiment is applied will be described. In addition, in the following description, an actual ST-MRAM was not manufactured, but only a sample for measuring a magnetic characteristic was manufactured and the experiment was performed.

Magnetic Layer: Thickness

Experiment Example 1

MgO of 2 nm was formed as an oxide layer on a silicon substrate on which an oxide film was coated, using rf magnetron sputtering. Then, $Fe_{65}CO_{15}C_{20}$ as a magnetic layer was formed on the oxide layer by dc magnetron sputtering while changing a thickness within a range of 0.4 to 1.6 nm. Then, Zr of 5 nm was formed as the carbon adsorbing layer on the magnetic layer using dc magnetron sputtering. After forming the carbon adsorbing layer, a heat treatment was performed at 300° C. for one hour and thereby samples of the experiment example 1 were manufactured.

Experiment Example 2

MgO of 2 nm was formed as an oxide layer on a silicon substrate on which an oxide film was coated, using rf magnetron sputtering. Then, $Fe_{40}Ni_{35}C_{25}$ as a magnetic layer was formed on the oxide layer by dc magnetron sputtering while changing a thickness within a range of 0.6 to 2.2 nm. Then, Zr of 5 nm was formed as the carbon adsorbing layer on the magnetic layer using dc magnetron sputtering. After forming the carbon adsorbing layer, a heat treatment was performed at 300° C. for one hour and thereby samples of the experiment example 2 were manufactured.

Figure 2:
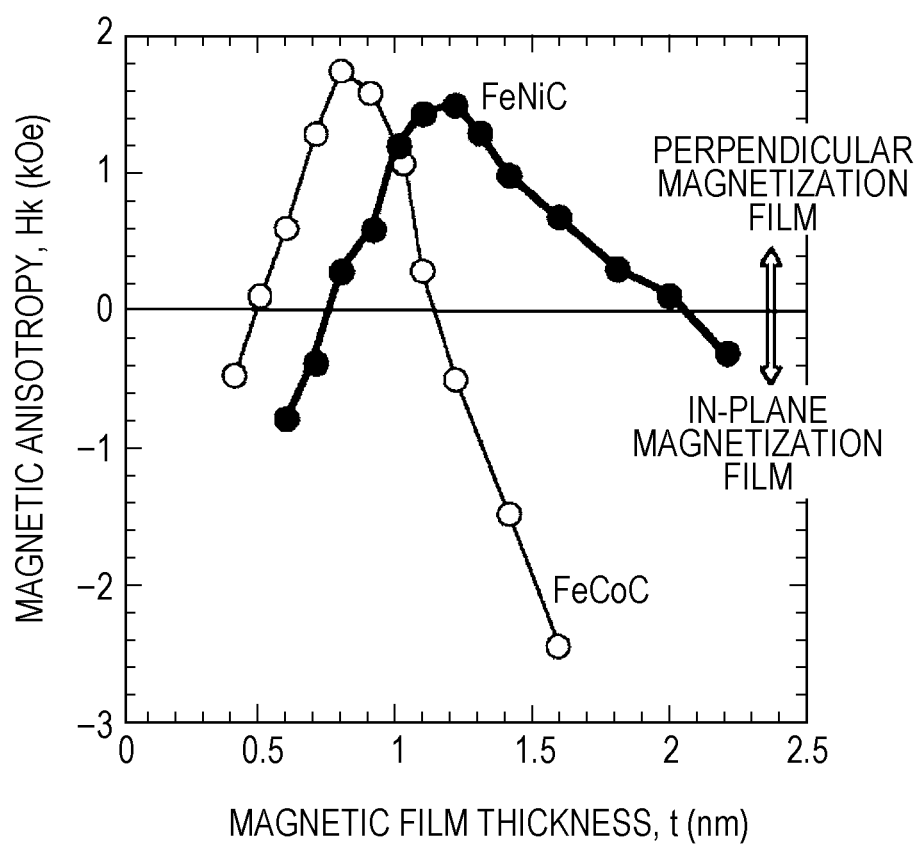
FIG. 2 is a diagram illustrating change in magnetic anisotropy with respect to a thickness of a magnetic layer, in regard to samples of experiment examples 1 and 2.

A change in magnetic anisotropy with respect to a thickness of a magnetic layer of samples of experiment examples 1 and 2 was shown in FIG. 2. The magnetic anisotropy was obtained from saturated magnetization while applying a magnetic field with an in-plane manner and a perpendicular manner. In FIG. 2, positive magnetic anisotropy was illustrated as perpendicular magnetization and negative magnetic anisotropy was illustrated as in-plane magnetization.

In the samples of the experiment example 1 in which the magnetic layer was formed of FeCoC, it was possible to obtain perpendicular magnetization with samples having a small thickness and therefore in a thickness of 0.5 to 1.1 nm, a perpendicular magnetization film was obtained. In addition, in the samples of the experiment example 2 in which the magnetic layer was formed of FeNiC, it was possible to obtain perpendicular magnetization with samples having a thickness larger than FeCoC in the experiment example 1 and therefore in a thickness of 0.8 to 2 nm, a perpendicular magnetization film was obtained.

In addition, in the experiment examples 1 and 2, the compositions of $Fe_{65}CO_{15}C_{20}$ and $Fe_{40}Ni_{35}C_{25}$ of the magnetic layer were compositions in a single film before a heat treatment.

From this result, it can be seen that when the thickness of the magnetic layer is set to 0.05 to 2 nm, it is possible to form a memory element having perpendicular magnetization.

Magnetic Layer: Content of Carbon

Experiment Example 3

Next, in regard to samples similar to the experiment example 1, a FeCoC film of 0.8 nm as a magnetic layer was formed using dc magnetron sputtering. At this time, the magnetic layer was formed while changing a content of C in FeCoC. The content of C was changed within a range 5.3 to 100 atomic % with respect to a total content of Fe and Co. Then, Zr of 5 nm was formed as the carbon adsorbing layer on the magnetic layer using dc magnetron sputtering. After forming the carbon adsorbing layer, a heat treatment was performed at 300° C. for one hour and thereby samples of the experiment example 3 were manufactured.

A cross-section of the magnetic layer after subjecting to the heat treatment was observed using a transmission electron microscope having a composition analysis function, and a composition ratio of a content of Co included in the magnetic layer and at a portion within a range of 1 nm from the magnetic layer to the total content of FeCo was measured. In Table 1, a composition ratio (charged Co/FeCo ratio) of the content of carbon at the time of forming the magnetic layer with respect to a total content of FeCo before the heat treatment, and a composition ratio (measured C/FeCo ratio) of the content of carbon to a total content of FeCo after the treatment are shown. In addition, a magnetization direction (in-plane or perpendicular direction) of the magnetic layer in each composition is shown in Table 1.

TABLE 1

| Charged C/FeCo ratio | Measured C/FeCo ratio | Magnetization direction |
| --- | --- | --- |
| 5.3% | 2.2% | In-plane direction |
| 7.5% | 3.3% | Perpendicular direction |
| 17.6% | 12.1% | Perpendicular direction |
| 25% | 19.0% | Perpendicular direction |
| 42.9% | 33.2% | Perpendicular direction |
| 66.7% | 48.1% | Perpendicular direction |
| 81.8% | 68.5% | Perpendicular direction |
| 100% | 87.5% | In-plane direction |

In the samples of the experiment example 3, the carbon adsorbing layer was formed on the magnetic layer, and the carbon atoms migrate to the carbon adsorbing layer, such that the measured value of the carbon atoms in the vicinity of the magnetic layer is decreased a little compared to the charged value. In addition, in the magnetic layer after the heat treatment, the perpendicular magnetization was obtained with a wide ranged ratio of the content of carbon to the total content of FeCo, that is, 3 to 70 atomic %.

Carbon Adsorbing Layer: Perpendicular Magnetization

Experiment Example 4

After substituting a material of the carbon adsorbing layer on the magnetic layer, a magnetic characteristic was examined. In regard to samples similar to the experiment example 1, the magnetic layer was formed of FeCoC of 0.8 nm, and then each material shown in Table 2 was formed as the carbon adsorbing layer having a thickness of 5 nm. Then, a heat treatment was performed at 200 to 400° C. for one hour and thereby samples of the experiment example 4 were manufactured.

Figure 3A:
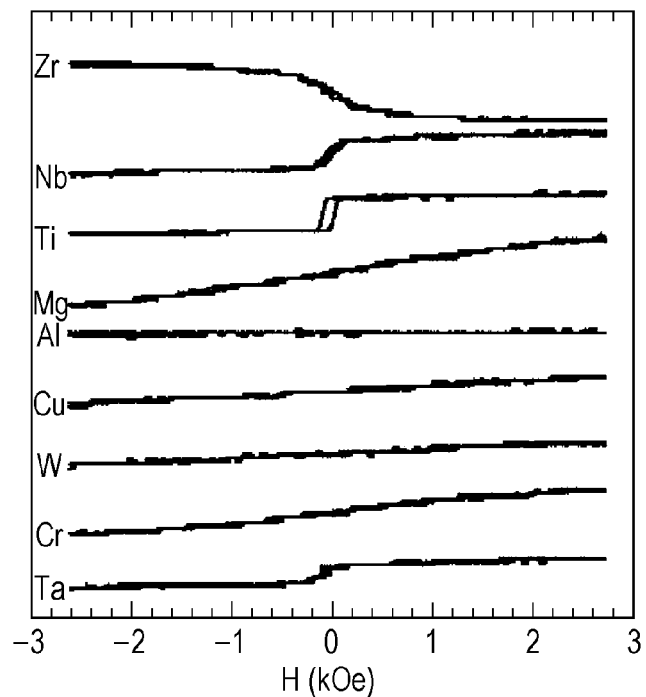
Figure 3B:
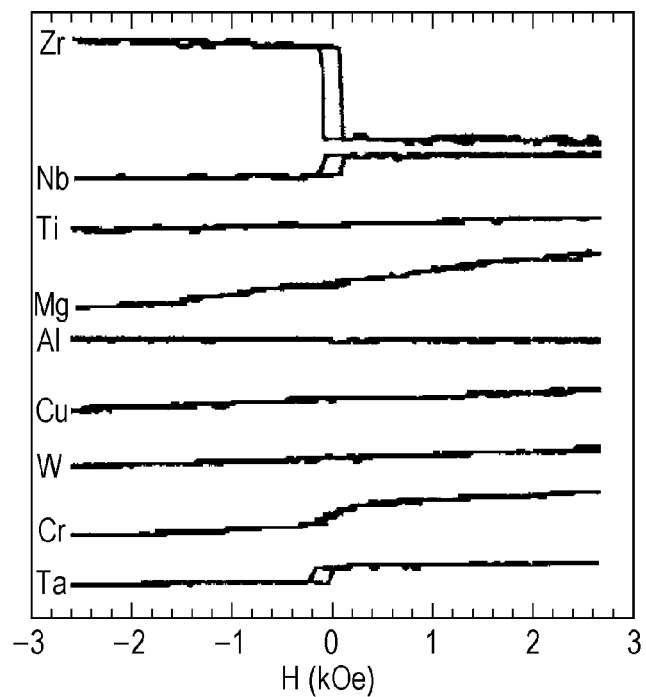

In regard to the samples of the experiment example 4 in which the carbon adsorbing layer was formed by each element, measurement results of a polar Kerr effect before the heat treatment and after the heat treatment at 300° C. are shown in FIG. 3A and FIG. 3B, respectively.

From the results shown in FIGS. 3A and 3B, it can be seen that perpendicular magnetization was obtained before the heat treatment only in the samples using Ti as the carbon adsorbing layer. In addition, perpendicular magnetization was obtained after the heat treatment only in the samples using Zr, Nb, and Ta as the carbon adsorbing layer. This is regarded to be because Ti is highly active, such that the adsorbing of carbon occurs similarly to the heat treatment while forming a film using dc magnetron sputtering, and carbon in the magnetic layer migrates to the carbon adsorbing layer, and therefore perpendicular magnetization was obtained before the heat treatment.

Table 2 shows a material of the carbon adsorbing layer of samples in which perpendicular magnetization was obtained before the heat treatment, or after the heat treatment at either temperature of 200° C., 300° C., or 400°, and a material of the carbon adsorbing layer of samples in which perpendicular magnetization was not obtained in any heat treatment.

TABLE 2

| Film in which perpendicular magnetization is obtained | Film in which perpendicular magnetization is not obtained |
| --- | --- |
| Zr, Hf, Y, Nb, Ti, V, Ta, $Ti_{50}W_{50}$, $Ni_{70}Zr_{30}$ | Mg, Al, Cu, W, Mo, Cr, Pd, Pt, Ru, Ag, Au, Rh, Ir |

As can be seen from Table 2, in samples using a single element of Ti, V, Nb, Zr, Ta, Hf, and Y, and an alloy thereof as the carbon adsorbing layer, it was possible to obtain perpendicular magnetization before the heat treatment or after the heat treatment. Contrary to this, in samples using Mg, Al, Cu, W, Mo, Cr, Pd, Pt, Ru, Ag, Au, Rh, and Ir as the carbon adsorbing layer, it was difficult to obtain perpendicular magnetization before the heat treatment or after the heat treatment. From this result, when a single element of Ti, V, Nb, Zr, Ta, Hf, and Y, and an alloy thereof is used, the content of carbon in the magnetic layer is controlled by the carbon adsorbing layer and therefore it is possible to adjust magnetization to have a perpendicular direction.

Oxide Layer: Perpendicular Magnetization

Experiment Example 5

Similarly to the experiment example 4, After substituting a material of the underlying layer (oxide layer) that comes into contact with the magnetic layer, a magnetic characteristic was examined. In regard to samples similar to the experiment example 1, each material shown in Table 3 was formed as the underlying layer having a thickness of 2 nm, and then FeCoC of 0.8 nm was formed as the magnetic layer on the underlying layer. After forming Zr of 5 nm on the magnetic layer, a heat treatment was performed at 300° C. for one hour and thereby samples of the experiment example 5 were manufactured.

Table 3 shows a material of the carbon adsorbing layer of samples in which perpendicular magnetization was obtained after the heat treatment, or after the heat treatment, and a material of the carbon adsorbing layer of samples in which perpendicular magnetization was not obtained in any heat treatment.

TABLE 3

| Underlying layer in which perpendicular magnetization is obtained | Underlying layer in which perpendicular magnetization is not obtained |
| --- | --- |
| MgO, CoO, NiO, TiO, $MgAl_2O_4$, $FeAl_2O_4$ | Ta, Ru, Zr, Au, Pd, Cu, $SiO_2$, $Al_2O_3$ |

As shown in Table 3, in samples using MgO, CoO, NiO, TiO, $MgAl_2O_4$, and $FeAl_2O_4$ as the underlying layer, it was possible to obtain perpendicular magnetization after the heat treatment. Contrary to this, it was difficult to obtain perpendicular magnetization in a metal underlying layer. In addition, in a case where an amorphous-based oxide such as $SiO_2$ and $Al_2O_3$ was used as the underlying layer, it was difficult to obtain perpendicular magnetization. From this result, it is necessary to use an oxide having an NaCl structure or a spinel structure as the underlying layer that comes into contact with the magnetic layer.

Magnetic Layer: Fe/Co Ratio, Fe/Ni Ratio

Next, in regard to the coercive force of the magnetic layer, dependency on a composition ratio of Fe, Co, and Ni was examined.

Experiment Example 6

Similarly to the experiment example 1, $(Fe_{100-x}Co_x)C$ film of 0.8 nm was formed as the magnetic layer while changing x. Here, x was changed within a range of 0 to 80. After forming Zr of 5 nm as the carbon adsorbing layer on the magnetic layer, a heat treatment was performed at 300° C. for one hour and thereby samples of the experiment example 6 were manufactured.

Experiment Example 7

Similarly to the experiment example 1, $(Fe_{100-x}Ni_x)C$ film of 0.8 nm was formed as the magnetic layer while changing x. Here, x was changed within a range of 0 to 80. After forming Zr of 5 nm as the carbon adsorbing layer on the magnetic layer, a heat treatment was performed at 300° C. for one hour and thereby samples of the experiment example 7 were manufactured.

Figure 4:
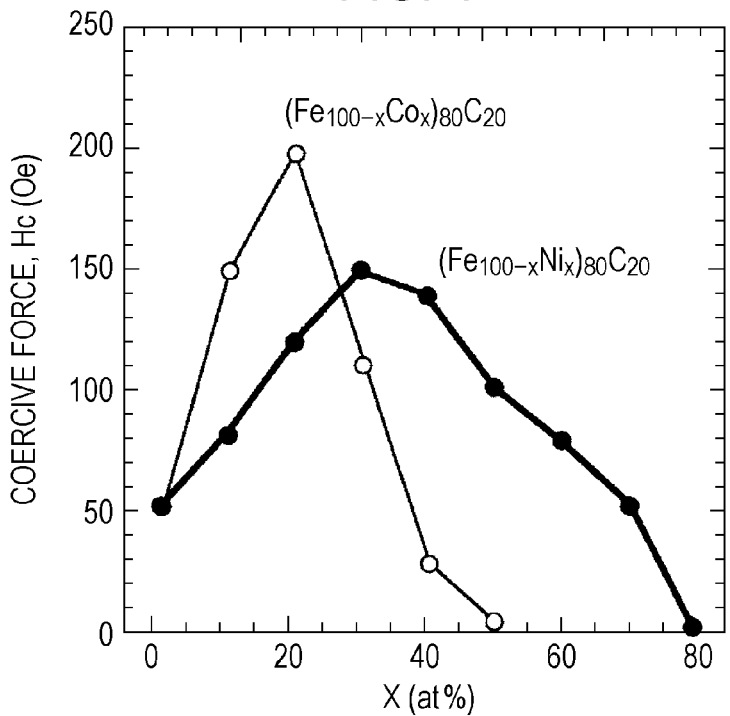
FIG. 4 is a diagram illustrating a relationship between a content x of Co or Ni and a perpendicular coercive force Hc, in regard to samples of experiment examples 6 and 7.

FIG. 4 shows a relationship between a ratio of x of Co or Ni and perpendicular coercive force Hc in the samples of the experiment example 6 using FeCoC magnetic layer and in the samples of the experiment example 7 using FeNiC magnetic layer.

From the results shown in FIG. 4, it can be seen that when Co and Ni are included together with Fe in the magnetic layer, coercive force is large than in the case of Fe alone, and therefore this configuration is excellent as a perpendicular magnetization film, but when Co and Ni are excessive, perpendicular magnetization disappears. From this result, it is preferable that a composition of Co added to Fe as a magnetic layer be greater than 1 atomic % and equal to or less than 30 atomic %. In addition, it is preferable that a composition of Ni added to Fe be greater than 1 atomic % and equal to or less than 7 atomic %.

Magnetic layer: Fe layer

Next, results of the case of forming the magnetic layer by inserting an Fe layer at a portion that comes into contact with the oxide layer is illustrated.

Experiment Example 8

Mgo of 2 nm as the oxide layer was formed, and then an Fe layer having a thickness t and $Ni_{60}Fe_{20}C_{20}$ of 1 nm were formed as the magnetic layer on the oxide layer. The thickness t was changed within a range of 0 to 0.5 nm. After forming Ta of 5 nm as the carbon adsorbing layer on the magnetic layer, a heat treatment was performed at 300° C. for one hour and thereby samples of the experiment example 8 were manufactured.

Experiment Example 9

Mgo of 2 nm as the oxide layer was formed, and then an Fe layer having a thickness t and $Ni_{80}C_{20}$ of 1 nm were formed as the magnetic layer on the oxide layer. The thickness t was changed within a range of 0 to 0.5 nm. After forming Ta of 5 nm as the carbon adsorbing layer on the magnetic layer, a heat treatment was performed at 300° C. for one hour and thereby samples of the experiment example 9 were manufactured.

Figure 5:
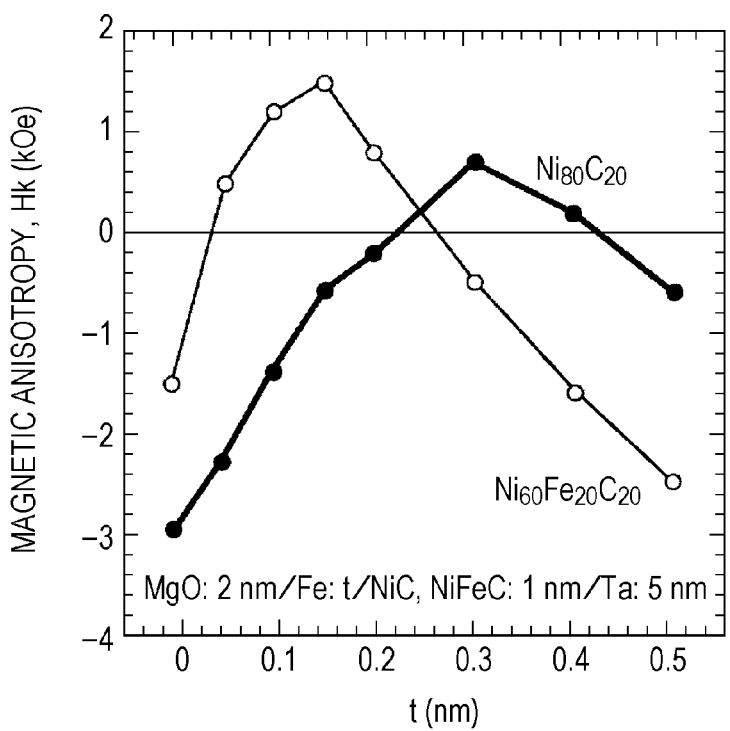
FIG. 5 is a diagram illustrating magnetic anisotropy dependency on a thickness t of Fe layer, in regard to samples of experiment examples 8 and 9.

In regard to the samples of the experiment example 8 and the samples of the experiment example 9, magnetic anisotropy dependency on the thickness t of the Fe layer provided at an interface of the oxide layer of MgO is shown in FIG. 5.

From the results shown in FIG. 5, it can be seen that in the case of not inserting the Fe layer, that is, in the case of using $Ni_{60}Fe_{20}C_{20}$ or $Ni_{80}C_{20}$ alone as the magnetic layer, it becomes an in-plane magnetization film in any case.

Contrary to this, in regard to the samples of the experiment example 8, in the case of inserting the Fe layer, the Fe layer of 0.1 to 0.2 nm was inserted between Mgo and $Ni_{60}Fe_{20}C_{20}$, such that perpendicular magnetization occurred. In addition, in regard to the samples of the experiment example 9, in the case of inserting the Fe layer, the Fe layer of 0.3 nm was inserted between Mgo and $Ni_{80}C_{20}$, such that perpendicular magnetization occurred.

From these results, it can be seen that not only in a case where the magnetic layer was formed as a single layered film but also in a case where the magnetic layer is divided into a plurality of layers including the Fe layer and a layer including carbon, perpendicular magnetization was obtained.

At this time, in regard to the magnetic layer, when a large amount of Fe is included in a portion that comes into contact with the oxide layer, the perpendicular magnetic anisotropy or the MR ratio becomes large, and when the amount of Fe was excessive, the decrease in the perpendicular magnetic anisotropy becomes large. In addition, a large amount of Fe is included in a portion apart from the oxide layer, the decrease in the perpendicular magnetic anisotropy becomes large, such that for example, even when the Fe layer is inserted between the layer including carbon and the carbon adsorbing layer instead of a side that comes into contact with MgO, perpendicular magnetization is not obtained.

In a case where the magnetic layer was formed by being divided into the plurality of layers including the Fe layer and the layer including carbon, it is possible to decrease the content of Fe in the magnetic layer. When the content of Fe in the magnetic layer, it is possible to decrease a magnetic moment of the magnetic layer. In addition, Fe is inferior in corrosion resistance, such that when the content of Fe is decreased, it is possible to increase the corrosion resistance of the memory element.

Non-Magnetic Layer

Next, an examination was made on a case where a non-magnetic layer is inserted between the magnetic layer and the carbon adsorbing layer.

Experiment Example 10

Through a method similar to the experiment example 1, MgO of 2 nm as an oxide layer was formed, and then $Fe_{65}CO_{15}C_{20}$ of 0.8 nm as a magnetic layer was formed on the oxide layer. Then, a Pd layer having a thickness t as a non-magnetic layer was formed on the magnetic layer. The thickness t was changed within a range of 0.1 to 0.8 nm. After forming Ta of 5 nm as the carbon adsorbing layer on the Pd layer, a heat treatment was performed at 400° C. for one hour and thereby samples of the experiment example 10 were manufactured.

Experiment Example 11

Through the same method as that in the experiment example 1, MgO of 2 nm as an oxide layer was formed, and then $Fe_{65}CO_{15}C_{20}$ of 0.8 nm as a magnetic layer was formed on the oxide layer. Then, an Au layer having a thickness t as a non-magnetic layer was formed on the magnetic layer. The thickness t was changed within a range of 0.1 to 0.8 nm. After forming Ta of 5 nm as the carbon adsorbing layer on the Au layer, a heat treatment was performed at 400° C. for one hour and thereby samples of the experiment example 11 were manufactured.

Figure 6:
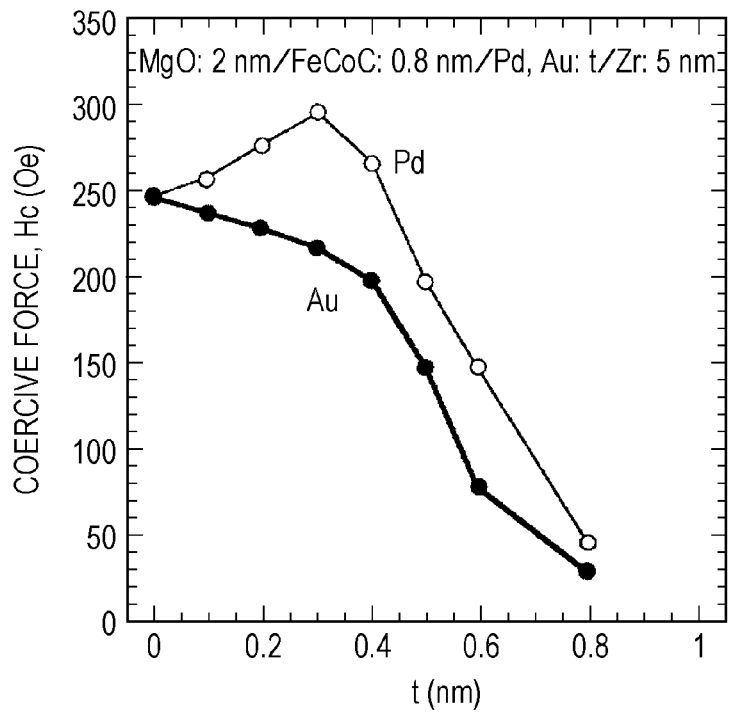
FIG. 6 is a diagram illustrating a relationship between a thickness t of Pd layer or Au layer and a perpendicular coercive force, in regard to samples of experiment examples 10 and 11.

FIG. 6 shows a relationship between a thickness t of Pd layer or Au layer and a perpendicular coercive force, in regard to samples of the experiment examples 10 and 11.

As shown in FIG. 6, in the samples in which the non-magnetic layer interposed between the magnetic layer and the carbon adsorbing layer, the coercive force increases or decreases, but a remarkable decrease in perpendicular magnetization is not found to a film thickness of 0.5 nm in both Pd and Au. From this result, it can be seen that even when the non-magnetic layer is inserted, carbon in the magnetic layer diffuses to the carbon adsorbing layer through the non-magnetic layer by the heat treatment. When the non-magnetic layer such as Pd is inserted, a magneto-striction of the memory element may be changed. Therefore, the non-magnetic layer such as Pd may be inserted to be used for adjusting the magneto-striction of the memory element or the like.

Table 4 shows a relationship between a non-magnetic layer element, a thickness, and a coercive force in a case where the non-magnetic layer is inserted between the magnetic layer and the carbon adsorbing layer similarly to the above-described experiment examples 10 and 11.

TABLE 4

| Non-magnetic layer | Coercive force |
|---|---|
| None | 250 Oe |
| Cr 0.3 nm | 330 Oe |
| Cr 0.5 nm | 270 Oe |
| Cu 0.3 nm | 220 Oe |
| Ag 0.3 nm | 210 Oe |
| Ru 0.3 nm | 300 Oe |
| Mo 0.3 nm | 270 Oe |
| W 0.3 nm | 320 Oe |
| Ir 0.3 nm | 210 Oe |

TABLE 4-continued

| Non-magnetic layer | Coercive force |
|---|---|
| Pt 0.3 nm | 410 Oe |
| Pt 0.5 nm | 220 Oe |
| Pt 0.7 nm | 100 Oe |

As shown in FIG. 4, in a case where Cr, Cu, Ag, Ru, Mo, W, Ir, and Pt is used as the non-magnetic layer, a large variation in the coercive force was not found if the thickness of the non-magnetic layer is 0.5 nm or less in any one of the above-described elements. In addition, in c case where a Pt layer of 0.7 nm was used as the non-magnetic layer, the coercive force was decreased to 100 Oe. Therefore, it is preferable that the thickness of the non-magnetic layer inserted between the magnetic layer and the carbon-adsorbing layer be 0.5 nm or less.

Carbon Adsorbing Layer: Thickness

Next, an examination was made on a relationship between the thickness of the carbon adsorbing layer and the coercive force.

Experiment Example 12

Zr having a thickness t as the carbon adsorbing layer was formed on a silicon substrate on which an oxide film was coated, using rf magnetron sputtering. The thickness t was changed within a range of 0.4 to 1.6 nm. $Ni_{40}Fe_{40}C_{20}$ of 1 nm as a magnetic layer was formed on the carbon adsorbing layer using dc magnetron sputtering. Then, MgO of 2 nm was formed as an oxide layer on the carbon adsorbing layer, and then a heat treatment was performed at 300° C. for one hour and thereby samples of the experiment example 12 were manufactured.

Figure 7:
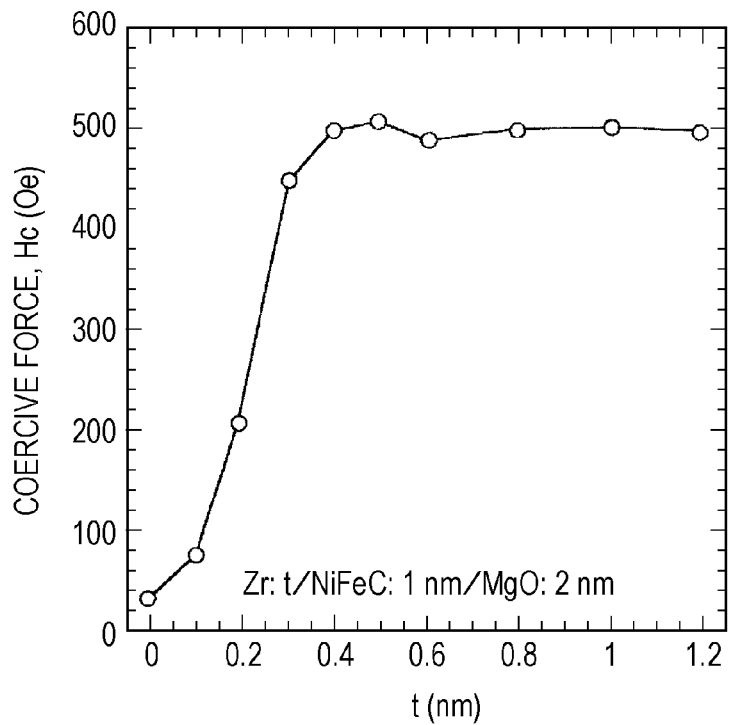
FIG. 7 is a diagram illustrating a relationship between a thickness t of a Zr layer that is a carbon adsorbing layer and the coercive force, in regard to samples of experiment example 12.

FIG. 7 shows a relationship between the thickness t of the Zr layer that is the carbon adsorbing layer and the coercive force in the experiment example 12. When the thickness of the carbon adsorbing layer was 0.3 nm or more, the coercive force was substantially saturated. Therefore, the carbon adsorbing layer is capable of sufficiently adjusting the content of carbon even in a thin film of substantially 0.3 nm, and therefore it was confirmed that a sufficient effect was revealed.

If the carbon adsorbing layer can be made to be thin, in a case where the memory layer is applied to a memory using a magnetic domain wall migration, or the like, it is possible to decrease a current flowing other than the magnetic layer, and therefore this configuration is effective for the decrease in an operating current.

Magnetic Layer: Carbon Adsorbing Layer

A case where the magnetic layer and the carbon adsorbing layer were formed of a plurality of magnetic materials will be described.

Experiment Example 13

Similarly to the experiment example 1, MgO of 2 nm was formed as an oxide layer. Each material shown in Table 5 as a first magnetic layer was formed, and then each material shown in Table 5 as a second magnetic layer was formed on the first magnetic layer. Then, Ru of 5 nm as a cap layer was formed on the second magnetic layer, and a heat treatment was performed at 300° C. for one hour and thereby samples of the experiment example 13 were manufactured.

In regard to each sample of the experiment example 13, a relationship between a combination of the first and second magnetic layers, and the perpendicular coercive force is shown in Table 5.

TABLE 5

| First magnetic layer | Second magnetic layer | Coercive force |
|---|---|---|
| $Fe_{80}C_{20}$ 0.5 nm | $Co_{70}Zr_{30}$ 0.3 nm | 170 Oe |
| $Fe_{80}C_{20}$ 0.3 nm | $Ni_{70}Fe_{20}Zr_{10}$ 0.7 nm | 230 Oe |
| $Fe_{80}C_{20}$ 0.3 nm | $Fe_{70}Co_{15}Ta_{15}$ 0.5 nm | 200 Oe |
| $Fe_{90}C_{10}$ 0.3 nm | $Ni_{70}Fe_{20}Zr_{10}$ 0.5 nm | 320 Oe |
| $Fe_{70}Co_{15}C_{15}$ 0.5 nm | $Ni_{70}Fe_{20}Zr_{10}$ 0.5 nm | 230 Oe |
| Fe 0.3 nm | $Ni_{70}Fe_{20}Zr_{10}$ 0.5 nm | In-plane magnetization |
| $Fe_{80}Ta_{20}$ 0.5 nm | $Ni_{60}Fe_{20}C_{20}$ 0.5 nm | In-plane magnetization |
| $Fe_{80}C_{20}$ 0.5 nm | Ni 0.5 nm | In-plane magnetization |

As shown in Table 5, in a case where the first magnetic layer was formed of a magnetic layer including carbon and the second magnetic layer was formed of a magnetic layer including a Zr or Ta, it was possible to obtain perpendicular magnetization. However, in a case where the first magnetic layer did not include carbon and the second magnetic layer did not include Zr or Ta, it was difficult to obtain perpendicular magnetization and led to in-plane magnetization. As described above, when the first magnetic layer was formed of a magnetic material including carbon at the oxide side and the second magnetic layer including the carbon adsorbing element was formed on the first magnetic layer including carbon, perpendicular magnetization was obtained.

From the above-described results, it is possible to configure the magnetic layer and the carbon adsorbing layer, by a first magnetic layer formed of Fe and a material including carbon, and a second magnetic layer formed of a composition including an element that adsorbs carbon, and at least one selected from a group consisting of Fe, Co, and Ni. In this case, the second magnetic layer functions as not only the magnetic layer but also the carbon adsorbing layer. That is, the magnetic layer and the carbon adsorbing layer seem to be integrally formed. In this manner, even in the case of a configuration where the magnetic layer and the carbon adsorbing layer seems as if these are integrally formed, when a layer containing an element that adsorbs carbon is provided on the magnetic layer including carbon, perpendicular magnetization was obtained.

Memory Element

Next, a magnetization inversion magnetic memory element of the spin injection type was actually manufactured by using the magnetic layer according to the above-described magnetic layer, and a characteristic thereof was examined.

Experiment Example 14

Ta of 5 nm and Ru of 5 nm as an underlying layer are formed on a substrate using a method similar to the experiment example 1. Then, a magnetization-fixed layer in which CoPt of 2 nm, Ru of 0.45 nm, and CoFeB of 1 nm are perri-combined was formed as the magnetization-fixed layer on the underlying layer. Next, MgO of 0.8 nm was formed as the oxide layer on the magnetization-fixed layer. As the recording layer on the oxide layer, a magnetic layer including Fe of 0.15 nm and $Ni_{40}Fe_{40}C_{20}$ of 1 nm is laminated on the oxide layer, and Ta of 5 nm was formed as the carbon adsorbing layer on the recording layer. Then, a heat treatment was performed at 300° C. for one hour and thereby samples of the experiment example 14 were manufactured. The memory element had a circular shape with a diameter of 150 nm.

Experiment Example 15

Comparative Example

Ta of 5 nm and Ru of 5 nm as an underlying layer are formed on a substrate using a method similar to the experiment example 1. Then, a magnetization-fixed layer in which CoPt of 2 nm, Ru of 0.45 nm, and CoFeB of 1 nm are perri-combined was formed as the magnetization-fixed layer on the underlying layer. Next, MgO of 0.8 nm was formed as the oxide layer on the magnetization-fixed layer. As the recording layer on the oxide layer, a laminated film of Co of 0.2 nm and Pd of 0.8 nm was formed with three cycles, and Ta of 5 nm as a cap layer was formed on the recording layer. Then, a heat treatment was performed at 300° C. for one hour and thereby samples of the experiment example 15 (comparative example) were manufactured. The memory element had a circular shape with a diameter of 150 nm.

In Table 6, an inversion current, resistance $K_UV/k_BT$ against thermal fluctuation, and an MR ratio of the samples of the experiment examples 14 and 15 are shown.

TABLE 6

|  | Experiment example 14 | Experiment example 15 |
| --- | --- | --- |
| Configuration of magnetic layer | Fe: 0.15 nm/ $Ni_{40}Fe_{40}C_{20}$: 1 nm | [Co: 0.2 nm/ Pd: 0.8 nm] × 3 |
| Inversion current | 120 μA | 630 μA |
| $KV/k_BT$ | 48 | 41 |
| MR ratio | 113% | 12% |

As shown in Table 6, the inversion current was 120 vA in the experiment example 14, and contrary to this, 630 μm in the experiment example 15. In this way, in the sample having a configuration in which Fe and NiFeC were laminated as the magnetic layer, the inversion current is low, such that it is possible to configure a memory element suitable for low write current.

In addition, in regard to the resistance against thermal fluctuation and the MR ratio, those in the experiment example 14 are larger than those in the experiment example 15. In addition, a magnetic braking constant obtained from a ferromagnetic resonance in a memory element state was 0.025 in the samples of the experiment example 14 and 0.13 in the samples of the experiment example 15.

As described above, in the spin injection magnetization inversion magnetic memory of the experiment example 14 using the magnetic layer including the Fe, and NiFeC, the magnetic braking constant is small and magnetization inversion may be realized with a low current, such that this memory is effective as a low power consumption magnetic memory.

Magnetic Domain Wall Migration-Type Memory Element

Next, a case where the magnetic layer of the above-described embodiment is applied to a magnetic domain wall migration-type memory element will be described.

Experiment Example 16

First, a carbon adsorbing layer was formed of Zr of 0.3 nm as an underlying layer. Then, $Ni_{40}Fe_{40}C_{20}$ of 1 nm as a magnetic layer and MgO of 2 nm as an oxide layer were laminated on the carbon adsorbing layer, and then a heat treatment was performed at 300° C. for one hour. From this memory element, a strip-shaped pattern having a width of 100 nm and a length of 30 μm was formed, and an electrode was formed at both ends of the memory element and thereby samples of the experiment example 16 were manufactured.

Experiment Example 17

Comparative Example

Zr of 0.3 nm was formed as an underlying layer. Then, a magnetic layer in which a laminated film formed of Ru of 3 nm, Co of 0.5 nm, and Ni of 0.7 nm were laminated with five cycles was formed on the underlying layer. Then, MgO of 2 nm was formed as the oxide layer on the magnetic layer, and then a heat treatment was performed at 300° C. for one hour. From this memory element, a strip-shaped pattern having a width of 100 nm and a length of 30 μm was formed, and an electrode was formed at both ends of the memory element and thereby samples of the experiment example 17 were manufactured.

In regard to the samples of the experiment example 16 and the samples of the experiment example 17, a pulse current was made to flow to both ends of the samples, and a migration velocity of the magnetic domain wall with respect to the current was obtained. A result thereof is shown in FIG. 8.

Figure 8:
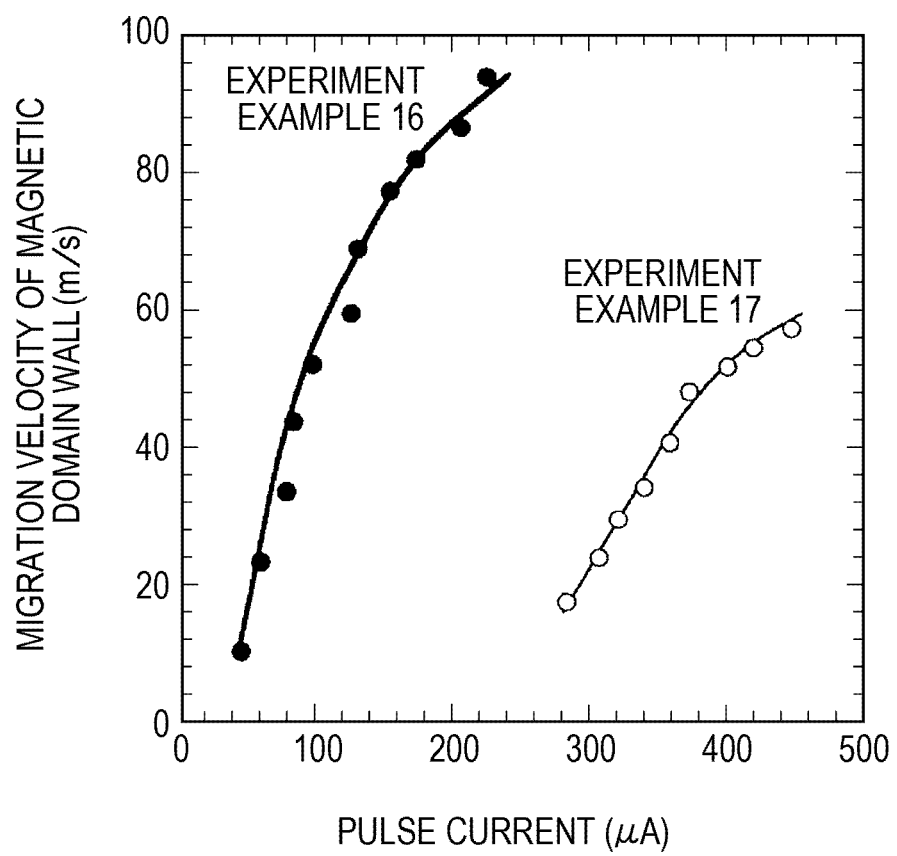
FIG. 8 is a diagram illustrating a migration velocity of a magnetic domain wall with respect to a current, in regard to samples of experiment examples 16 and 17.

As shown in FIG. 8, in the samples of the experiment example 16, a large migration velocity of magnetic domain wall was obtained with a relatively small current compared to the samples of the experiment example 17. From this result, in a case where the configuration of the magnetic memory according to the embodiment is applied to a magnetic domain wall migration-type magnetic memory, it is possible to decrease a current necessary for the magnetic domain wall migration, and it is possible to significantly decrease an operating current.

As described above, according to the embodiment, it is possible to configure a memory element in which the oxide layer is set as a tunnel barrier layer, and magnetization inversion is performed through spin injection torque which works between magnetic layers disposed at both sides of the tunnel barrier layer. In addition, when a magnetic material that includes at least one kind of element selected from a group consisting of Fe, Co, and Ni, and carbon is used as a memory layer of a memory device, in a case where this memory layer is used in a recording layer accompanied with magnetization inversion, it is possible to realize a magnetic memory in which a decrease in a current necessary for inversion and the low power consumption are realized. In addition, when a layer formed of a carbon adsorbing layer including at least one selected from a group consisting of Ti, V, Nb, Zr, Ta, Hf, and Y is formed on the magnetic layer including carbon, it is possible to further decrease the current necessary for magnetization inversion. In addition, when the configuration of the memory element according to the present application is used for the magnetic domain wall migration-type memory element, it is possible to realize the decrease in a driving current of the magnetic domain wall.

It should be understood that various changes and modifications to the presently preferred embodiments described herein will be apparent to those skilled in the art. Such changes and modifications can be made without departing from the spirit and scope and without diminishing its intended advantages. It is therefore intended that such changes and modifications be covered by the appended claims.

The application is claimed as follows:
1. A memory element, comprising:
  a magnetic layer that includes at least one kind of element selected from the group consisting of Fe, Co, and Ni, and carbon, has a content of carbon that is equal to or greater than 3 atomic % and less than 70 atomic % with respect to a total content of Fe, Co, and Ni, and has magnetic anisotropy in a direction perpendicular to a film face; an oxide layer that is formed of an oxide having a sodium chloride structure or a spinel structure and that comes into contact with the magnetic layer; and
  a layer including an element that adsorbs carbon, wherein the layer including an element that adsorbs carbon is formed on a face of the magnetic layer that is opposite to a face on which the oxide layer is formed, and wherein carbon in the magnetic layer is chemically coupled to the element that adsorbs carbon.

2. The memory element according to claim 1,
wherein the layer including an element that adsorbs carbon includes at least one kind selected from a group consisting of Ti, V, Nb, Zr, Ta, Hf, and Y, as the element that adsorbs carbon.

3. The memory element according to claim 2,
wherein the layer including an element that adsorbs carbon is formed of an alloy that includes at least one kind of element selected from a group consisting of Ti, V, Nb, Zr, Ta, Hf, and Y, and at least one kind of element selected from a group consisting of Fe, Co, and Ni.

4. The memory element according to claim 1,
wherein the magnetic layer, and a layer serving as a reference for information recorded in the magnetic layer are laminated with the oxide layer interposed therebetween.

5. The memory element according to claim 1,
wherein a thickness of the magnetic layer is from 0.5 to 2 nm.

6. The memory element according to claim 1,
wherein the magnetic layer includes Fe, carbon, and at least one element selected from the group consisting of Co and Ni, and
wherein a ratio of Co to Fe is greater than 1 atomic % and equal to or less than 30 atomic %, and a ratio of Ni to Fe is greater than 1 atomic % and equal to or less than 70 atomic %.

7. The memory element according to claim 1,
wherein the oxide layer is formed of MgO or $MgAl_2O_4$.

8. The memory element according to claim 1,
wherein a non-magnetic layer is provided between the layer including an element that adsorbs carbon and the magnetic layer.

9. A memory, comprising:
a memory element including a magnetic layer that includes at least one kind of element selected from a group consisting of Fe, Co, and Ni, and carbon, has a content of carbon that is equal to or greater than 3 atomic % and less than 70 atomic % with respect to a total content of Fe, Co, and Ni, and has magnetic anisotropy in a direction perpendicular to a film face, an oxide layer that is formed of an oxide having a sodium chloride structure or a spinel structure and that comes into contact with the magnetic layer, and a layer including an element that adsorbs carbon; and
an interconnect that supplies a current to the memory element,
wherein the layer including an element that adsorbs carbon is formed on a face of the magnetic layer that is opposite to the face on which the oxide layer is formed, and
wherein carbon in the magnetic layer is chemically coupled to the element that adsorbs carbon.

10. The memory element according to claim 1, wherein the oxide layer is formed of $MgAl_2O_4$.

11. The memory element according to claim 1, wherein the layer including an element that adsorbs carbon is formed directly on the face of the magnetic layer opposite to the face on which the oxide layer is formed.

12. The memory element according to claim 1, wherein a heat treatment is performed on the memory element after the layer including an element that adsorbs carbon is formed.

13. The memory element according to claim 1, wherein the layer including an element that adsorbs carbon is a magnetic layer.

14. The memory element according to claim 4, wherein a thickness of the layer serving as a reference for information recorded in the magnetic layer is larger than a thickness of the magnetic layer.

* * * * *